(12) United States Patent
Bandera et al.

(10) Patent No.: US 6,455,831 B1
(45) Date of Patent: Sep. 24, 2002

(54) CMOS FOVEAL IMAGE SENSOR CHIP

(75) Inventors: Cesar Bandera, East Brunswick, NJ (US); Peter Scott, Buffalo, NY (US); Ramalingam Sridhar, East Amherst, NY (US); Shu Xia, Amherst, NY (US)

(73) Assignee: The Research Foundation of Suny at Buffalo, Amherst, NY (US)

(*) Notice: Subject to any disclaimer, the term of this patent is extended or adjusted under 35 U.S.C. 154(b) by 0 days.

(21) Appl. No.: 09/393,254

(22) Filed: Sep. 10, 1999

Related U.S. Application Data

(60) Provisional application No. 60/100,045, filed on Sep. 11, 1998.

(51) Int. Cl.[7] ............................................. H01L 27/00
(52) U.S. Cl. ............................ 250/208.1; 250/208.6; 250/214.1
(58) Field of Search ......................... 250/208.1, 208.2, 250/208.6, 214.1; 382/274; 396/111, 115; 358/451, 453

(56) References Cited

U.S. PATENT DOCUMENTS 5,796,095 A * 8/1998 Matsuyama et al. ..... 250/208.1

OTHER PUBLICATIONS

Pardo et al., "CMOS Foveated Image Sensor: Signal Scaling and Small Geometry Effects," IEEE Transactions on Electron Devices, vol. 44, No. 10, pp. 1731–1737, Oct. 1997.*

E.R. Fossum. "Active pixel sensors–are CCD's dinosaurs?" in Charge–Coupled Devices and Solid–State OpticalSensors III. Proc. SPIE. vol. 1900, Feb. 1993, pp.2–14.

R. Nixon, S. Kemeny, C. Staller, and E. Fossum, "128x128 CMOS photodiode–type active pixel sensor with on–chip timimg, control and signal chain electronics" in Charge–Coupled Devices and Solid–State OpticalSensors V. Proc.SPIE, vol. 2415, Feb. 1995, paper No. 34.

S. Mendis, S. Kenemy, R. Gee, B. Pain, Q. Kim, and E. Fossum, "Progress in CMOS active pixel image sensors," in Proc.SPIE, vol. 2172, Feb. 1994, pp.19–29.

S. Mendis, S. Kenemy, R. Gee, B. Pain, C. Staller, Q. Kim, and E. Fossum, "CMOS active pixel image sensor for highly intergrated imaging systems", in IEEE Journal of Solid–State Circuits, Feb. 1997, pp.187–197.

C. Bandera and P. Scott, "Foveal machine vision systems." IEEE International Conference on Systems, Man, and Cybernetics. Cambridge, MA, Nov. 1989, pp. 569–599.

E. Franchi, M. Tartagni, R. Guerrieri, and G., Baccarani, "Random access analog memory for early vision", in IEEE Journal of Solid–State Circuits, vol. 27, No. 7, Jul. 1992.

T. Ebben, CCD electronics, Bell Aerospace Systems Group. 1996.

Panicacci, Roger. "Programmable multiresolution CMOS active pixel sensor." Proc. SPIE, vol. 2654, 1996.

* cited by examiner

Primary Examiner—Que T. Le
Assistant Examiner—Thanh X. Luu
(74) Attorney, Agent, or Firm—Simpson & Simpson, PLLC

(57) ABSTRACT

A foveal image sensor integrated circuit comprising a plurality of CMOS active pixel sensors arranged both within and about a central fovea region of the chip. The pixels in the central fovea region have a smaller size than the pixels arranged in peripheral rings about the central region. A new photocharge normalization scheme and associated circuitry normalizes the output signals from the different size pixels in the array. The pixels are assembled into a multi-resolution rectilinear foveal image sensor chip using a novel access scheme to reduce the number of analog RAM cells needed. Localized spatial resolution declines monotonically with offset from the imager's optical axis, analogous to biological foveal vision.

6 Claims, 8 Drawing Sheets

CMOS FOVEAL IMAGE SENSOR CHIP

This nonprovisional patent application claims the benefit under 35 U.S.C. Section 119(e) of United States Provisional Patent Application No. 60/100,045 filed on Sep. 11, 1998.

The U.S. Government has a paid-up license in this invention and the right in limited circumstances to require the patent owner to license others on reasonable terms as provided for by the terms of Contract No. NAS1-20841 awarded by NASA.

FIELD OF THE INVENTION

The present invention relates generally to imaging and vision systems, more particularly to foveal imaging systems, and, even more particularly, to a CMOS foveal image sensor integrated circuit. The present invention also provides a novel photo charge normalization technique which enables use of the same charge amplifier with different size pixels while simultaneously providing a wide dynamic response to the incoming light.

BACKGROUND OF THE INVENTION

In contrast to the uniform acuity of conventional imaging systems, virtually all advanced biological vision systems sample the scene in a space-variant fashion. Retinal acuity varies by several orders of magnitude within the field-of-view (FOV). The region of the retina with notably high acuity, called the fovea, is typically a small percentage of the overall FOV (about 5%), centered at the optical axis. The wide FOV, with lower peripheral acuity, and high acuity fovea results in a much smaller data set than supporting the entire FOV uniformly at high acuity. Inherent with space variant sampling is the context-sensitive articulation of the sensor's optical axis whereby the fovea is aligned with relevant features in the scene. These features can be targets such as predators, preys or classification features on the targets themselves. Space-variant sampling and intelligent gaze control together with multi-resolution image analysis are collectively called foveal vision.

The key benefits of foveal vision are its simultaneously achieving wide FOV, high resolution and fast frame rates. This makes it particularly well suited for time critical (real-time) applications traditionally associated with high bandwidth uniform vision, such as those of fast automata and active pursuit scenarios.

In general, foveal vision offers a visual information acquisition power that is superior to uniform acuity vision. A metric of visual information acquisition power is the product of FOV and spatial resolution and frame rate. In a foveal system, the metric is computed as the product of the total (i.e. peripheral) FOV, the spatial resolution at the fovea, and the overall frame rate.

The higher central resolution of foveal vision improves target classification by increasing recognition confidence and reducing classification error. The wider FOV of foveal vision reduces search and detection time, and improves the reliability of target tracking and pursuit.

The faster frame rate improves the behavioral response of vision driven autonomous agents, i.e. improves the system's ability to detect brief events and fast phenomena without temporal aliasing effects. Allowing shorter time between images improves the temporal (frame-to-frame) correlation of image features for more robust motion perception, and permits the use of simpler kinematics prediction models, which need not predict as far into the future. These benefits support more accurate navigation, target tracking and intercept, obstacle avoidance, and smoother control of articulations (better hand-eye coordination).

The theoretical basis for the general concepts of a foveal machine vision system was set forth in a doctoral thesis entitled Foveal Machine Vision Systems, by Cesar Bandera, submitted to the Department of Electrical and Computer Engineering, State University of New York at Buffalo in August, 1990. Although this thesis presented the theoretical underpinnings for a foveal machine vision system, and also suggested the need for a VLSI implementation of the invention, heretofore no one has solved the technical problems associated with such an integrated circuit reduction to practice.

Further background information related to the present invention can be found in the following references:

[1] E. R Fossum. "Active pixel sensors-are CCD's dinosaurs?" in Charge-Coupled Devices and Solid-State OptiicalSensors III Proc.SPIE. vol. 1900, February 1993, pp.2–14

[2] R. Nixon, S. Kemeny, C. Staller, and E. Fossum, "128×128 CMOS photodiode-type active pixel sensor with on-chip timing, control and signal chain electronics" in Charge-Coupled Devices and Solid-State OpticalSensors V. Proc.SPIE, vol. 2415, February 1995, paper no. 34

[3] S. Mendis, S. Kenemy, R. Gee, B. Pain, Q. Kim, and E. Fossum, "Progress in CMOS active pixel image sensors," in Proc.SPIE, vol. 2172, February 1994, pp. 19–29

[4] S. Mendis, S. Kenemy, R. Gee, B. Pain, C. Staller, Q. Kim, and E. Fossum, "CMOS active pixel image sensor for highly integrated imaging systems", in IEEE Journal of Solid-State Circuits, February 1997, pp. 187–197

[5] C. Bandera and P. Scott, "Foveal machine vision systems.", IEEE International Conference on Systems, Man, and Cybernetics. Cambridge, Mass., November 1989, pp.569–599

[6] E. Franchi, M. Tartagni, R. Guerrieri, and G. Baccarani, "Random access analog memory for early vision", in IEEE Journal of Solid-State Circuits, vol. 27, no.7, July 1992

[7] T. Ebben, CCD electronics, Ball Aerospace Systems Group. 1996

[8] D. Wobschall, Circuit design for electronic instrumentation, $2^{nd}$ edition, McGraw-Hill

SUMMARY OF THE INVENTION

The present invention comprises a foveal image sensor integrated circuit, having a first plurality of CMOS active pixels of a first size arranged in a central fovea region on a substrate of the circuit, a second plurality of CMOS active pixels of a second size arranged in a first peripheral ring about the central fovea region; and, a normalization circuit operatively arranged to normalize a photocharge applied to each of the different size pixels such that an output signal of each of the second size pixels is equal to an output signal of each of the first size pixels when the first and second size pixels are subjected to equal illumination.

A general object of the present invention is to provide a CMOS integrated circuit foveal image sensor.

A secondary object of the present invention is to provide a charge normalization scheme and circuit for normalizing the output signals of pixels of varying sizes in a foveal sensor array.

These and other objects, features and advantages of the present invention will become readily apparent to those having ordinary skill in the art upon a reading of the following detailed description of the preferred embodiment in view of the attached drawings and appended claims.

DETAILED DESCRIPTION OF THE PREFERRED EMBODIMENT

Figure 1:
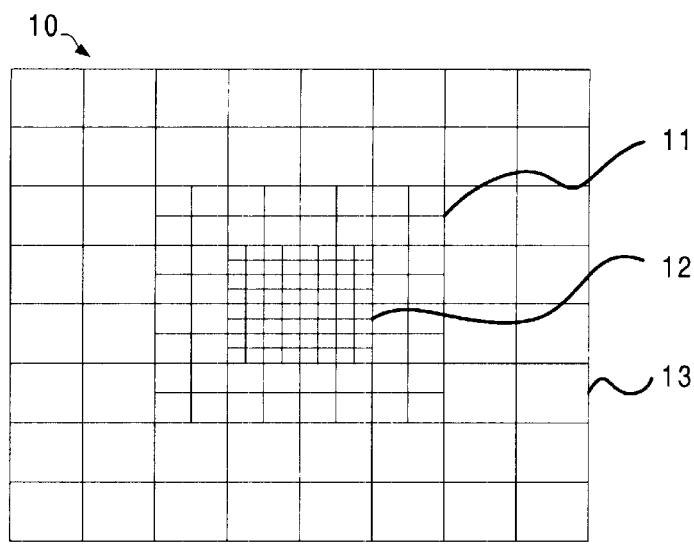
FIG. 1 is a drawing which illustrates a subdivided exponential lattices (2 rings around the fovea, r=2, d=2)

This work uses a class of retinotopologies called subdivided exponential lattices. An exponential lattice consists of a fovea of size 4d×4d pixels surrounded by r rings of large resolution cells, or rexels, each ring being d rexels wide. The number of rings, r, and the subdivision factor d uniquely define the exponential lattice. Its rectilinear structure and power-of-two self-symmetry support scale-space processing. FIG. 1 shows the subdivided exponential lattice.

Through simple calculation, we have the number of resolution cells, or rexels, in an exponential lattice with subdivision factor d and r major rings as $$A_{r,d} = d^2(16+12r).$$

FOV width, in foveal pixel units is $$W_{r,d} = 2^{r+2}d$$

The bandwidth compression factor, defined as the ratio between the number of pixels in a uniform acuity image, and the number of elements in a foveal image with the same FOV and maximum resolution, is an indication of the savings in data processing. The compression factor for the subdivided exponential lattice is given by the following equation:

$$f_c = \frac{(W_{r,d})^2}{A_{r,d}} = \frac{2^{2r+2}}{4+3r}$$

As a reference, consider that human vision has a 16.000:1 compression factor.

In general, foveal active vision features imaging sensors and processing with graded acuity coupled with context sensitive gaze control, analogous to that prevalent throughout vertebrate vision. Foveal vision can perform heterogenous vision tasks in uncontrolled environments, such as those of multitarget tracking (MTT) and automatic target recognition (ATR) more efficiently than uniform acuity vision. This is because resolution is treated as a dynamically allocatable resource, simultaneously achieving wider field-of-view, good localized resolution, and fast frame rates with significantly reduced processing requirements.

Active Pixel with Photo Charge Normalization

For image sensing, CDD's are currently the dominant technology. However, CCD's cannot be easily integrated with CMOS circuits due to additional fabrication complexity and increased cost. Also, due to additional limitations, the development of a CMOS-compatible image sensor technology is necessary for highly integrated imaging systems. Also, CMOS is well suited for implementing on-chip signal processing circuits and is a widely accessible and well-understood technology.

Recent research in imaging has focused on the CMOS active pixel image sensors. It is defined to have one or more active transistors within the pixel unit cell. Many research institutions including NASA JPL have done extensive work on this topic. Some major innovations such as the use of intra-pixel charge transfer to allow Correlated Double Sampling (CDS) and on-chip fixed pattern noise suppression circuitry are adopted to allow a CMOS active pixel image sensor to achieve low noise performance comparable to a CCD.

In our foveal imager, the pixel size increases exponentially from the central fovea region to the peripheral rings. In order to use the same charge amplifier with different size pixels and at the same time provide a wide dynamic response to the incoming light, a photo charge normalization mechanism is introduced.

Figure 2:
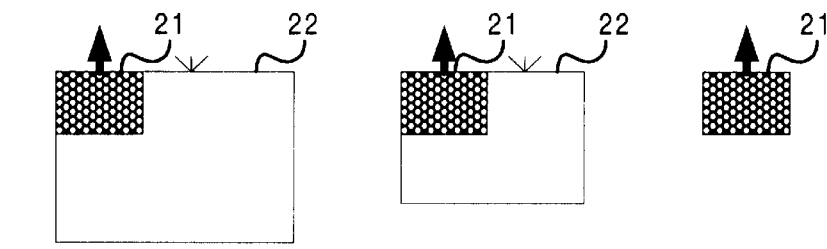
FIG. 2 illustrates the photo charge normalization technique of the present invention.

Traditional CCD or APS sensors transfer the entire charge to the read-out circuitry, and it is this practice that limits the dynamic range in the foveal sensor chip. However, during phototransduction, the pixel is an excellent conductor, and its charge is uniformly distributed over the cell area. (Relaxation time for local charge concentration fluctuations is measured in femtosecond). It is thus possible to transfer out of the cell not the entire charge but that of a sub-region of the cell. The output signal is then the value of the pixel scaled by the ratio of the pixel area to the sub-region area Consider three pixels, each scaled to $2^0$, $2^1$, and $2^2$ (FIG. 2 Photo charge normalization). All of the charge of the smallest pixel (below they are named as tiny pixels) is carried out in the traditional fashion. However, only one fourth of the charge of the next larger rexel is carried out. Likewise, only one sixteenth of the largest rexel is carried out. The signals from all three pixels, if illuminated equally, are the same. The fractional charge is isolated from the rest of the super pixel by raising a potential barrier. The signal Φ that raises and lowers the potential is just one of the read-out clock phase. The remaining charge will be dumped out before the start of the next integration cycle. Under equal illumination, though a larger rexel will have a larger total charge, its output signal is equal to that of the smaller pixels.

Figure 3A:
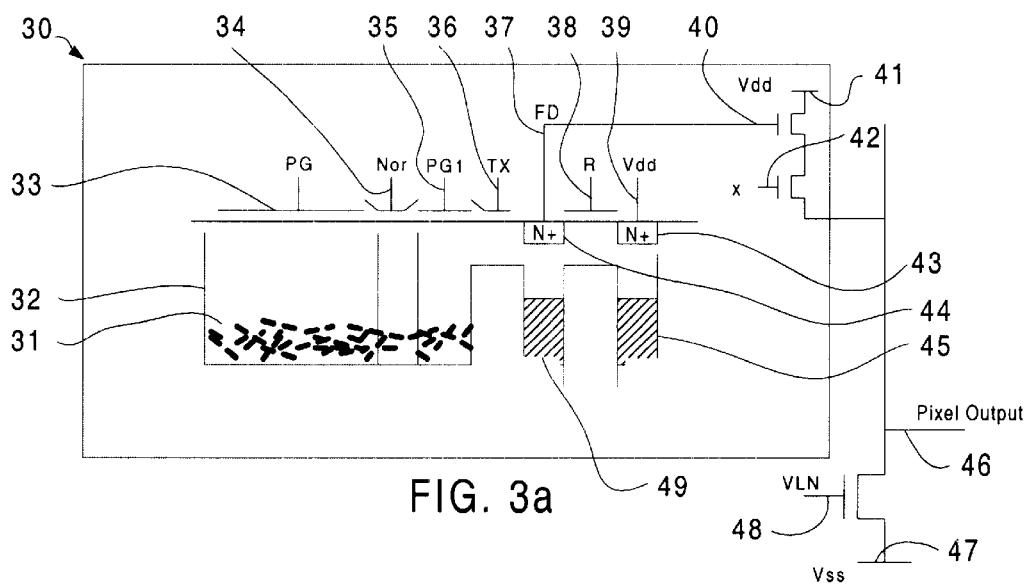
FIG. 3A is a schematic diagram for the CMOS active pixel with normalization.
Figure 3B:
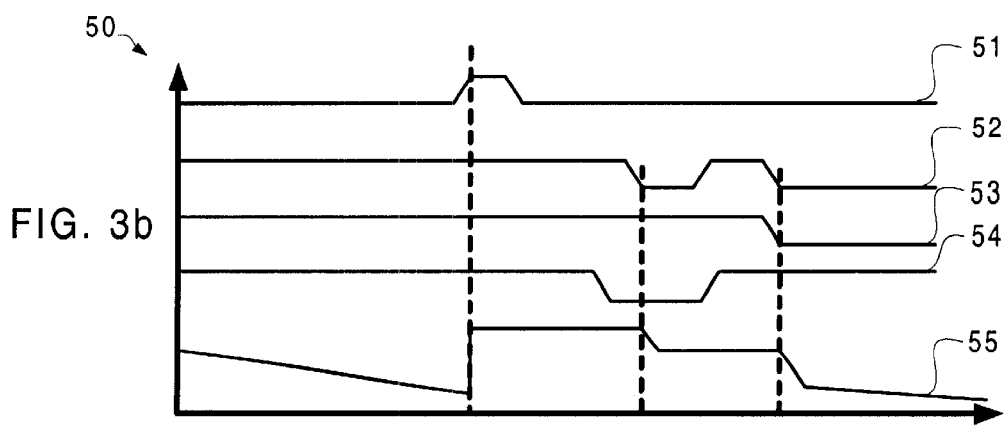
FIG. 3B is a timing diagram for the CMOS active pixel with normalization.
Figure 4A:
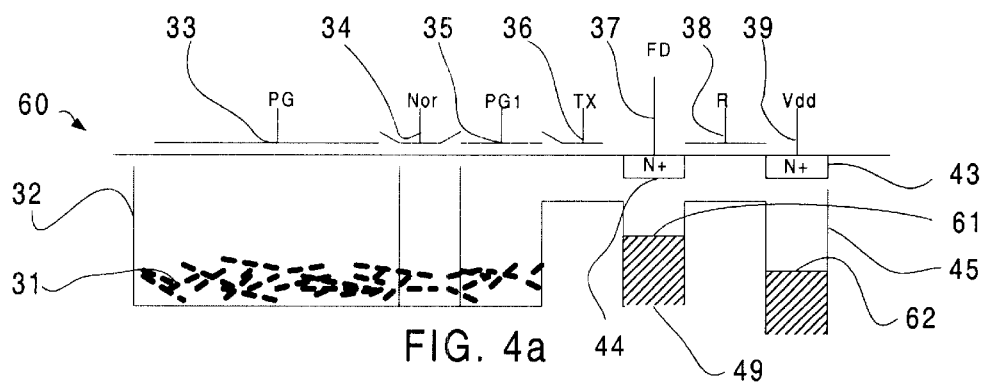
FIG. 4 illustrates operation of the CMOS active pixel with normalization, illustrating (a) charge integration; (b) reset; (c) charge normalization; (d) signal charge transfer; (e) remaining charge distribution; and (f) remaining charge transfer.
Figure 4B:
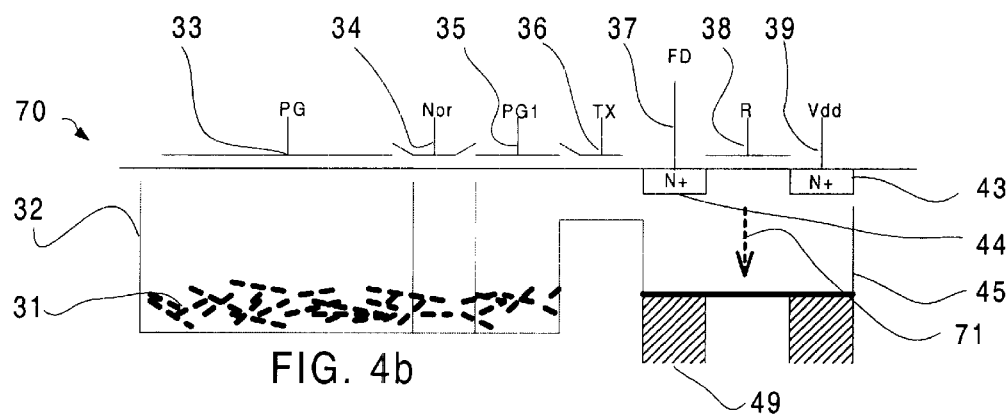
Figure 4C:
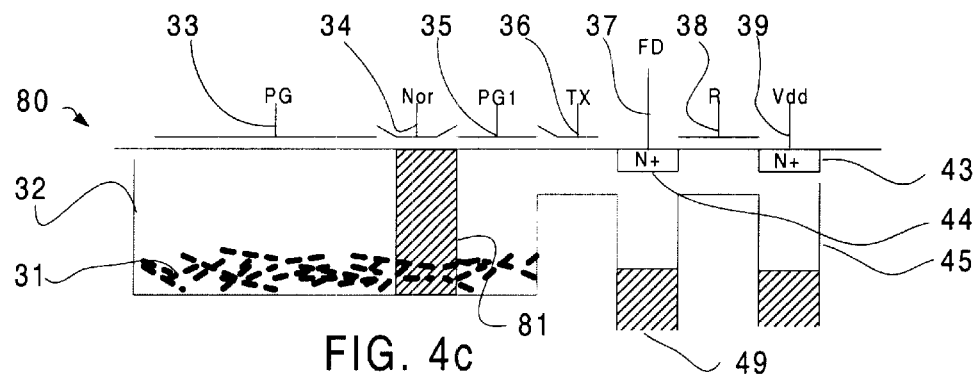
Figure 4D:
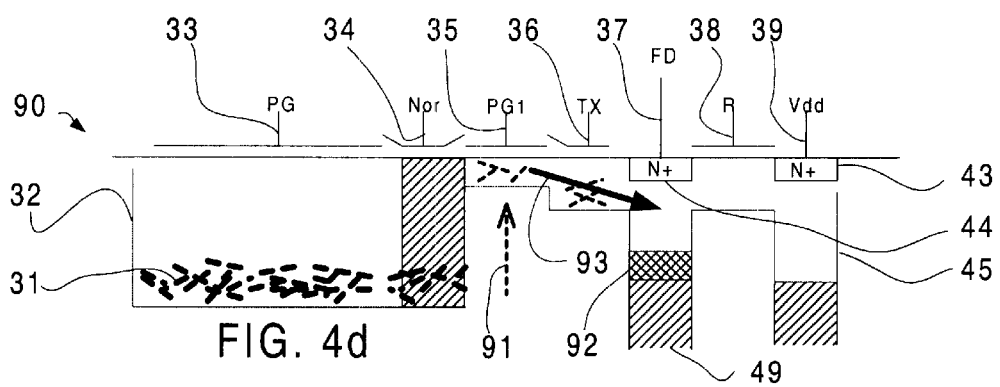
Figure 4E:
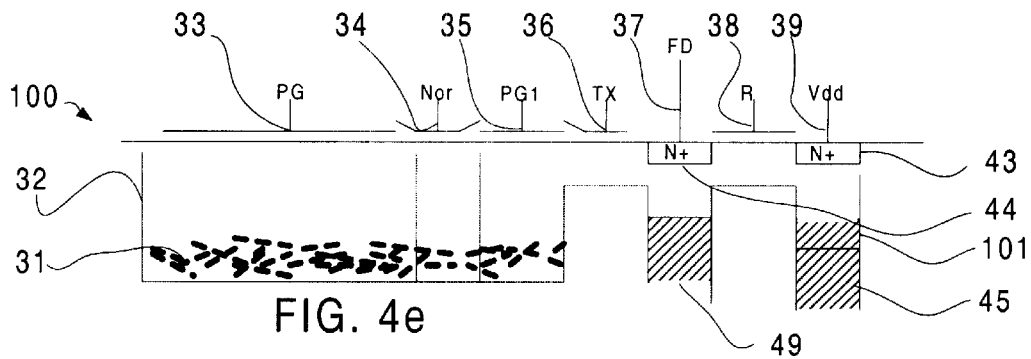
Figure 4F:
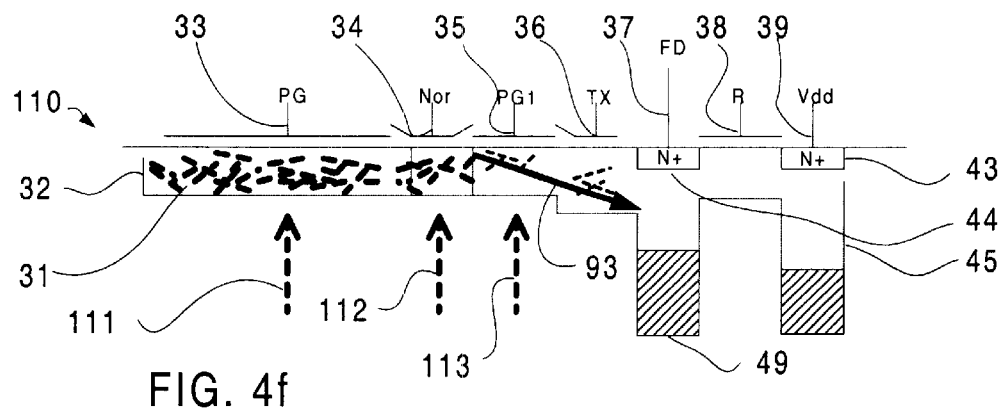

The CMOS active pixel with photo charge normalization is shown in FIG. 3. It is modified upon the NASA JPL active pixel without charge normalization. Actually in this foveal image sensor chip, the tiny pixels which are used in the central fovea region are the traditional active pixel proposed by NASA JPL. In FIG. 3, the pixel unit cell is shown within the dotted line. The imaging structure consists of two photo gates (PG1, PG2) separated by a narrow charge normalization gate (Norm), PG1 is of the size of a tiny pixel, whereas PG1 and PG2 combined form the super pixel. There is a floating diffusion output (FD) to accept the photo charge from the potential well generated under the photo gates. A transfer gate (TX) is built between the floating diffusion and the potential well. In essence, a surface channel CCD has been fabricated within each pixel. The pixel unit cell also contains a reset transistor, the input transistor of the in-pixel source follower and a row selection transistor. The readout circuit, which is common to an entire column of pixels, includes the load transistor.

The operation of this image sensor is as follows: The rail voltage is set to Vdd=+5v and Vss=0v, respectively. The transfer gate TX is biased at 2.5v. The load transistor of the in-pixel source follower is set at 1.5v. During the signal integration period, photo gate electrons are collected under the surface channel PG1 or PG2 biased at +5v. The reset transistor is biased at 2.5v to act as a lateral anti-blooming drain, allowing excess signal charge to flow to the reset drain. The floating diffusion output node (FD) is reset by briefly pulsing the reset gate to −5v during the integration period. The row selection transistor is biased off at 0v. Following signal integration, the voltage of the normalization gate (Norm) goes down to 0v. This will build a charge barrier between the potential wells under PG1 and PG2. Then the voltage of PG1 will go down to 0v to dump out the photo charge under PG1 but the voltage of PG2 still remain at 5v to capture the photo charge under PG2. This ends the read-out of the normalized signal. After that, the PG1 and Norm will go to 5v, thus the remaining charge will uniformly be distributed under PG1, PG2 and Norm. Finally the voltage of PG1 and PG2 will do down to 0v to dump out the remaining excess charge. This completes the whole signal read out cycle. The operation of the CMOS active pixel with charge normalization is given in FIG. 4.

Results

Figure 5:
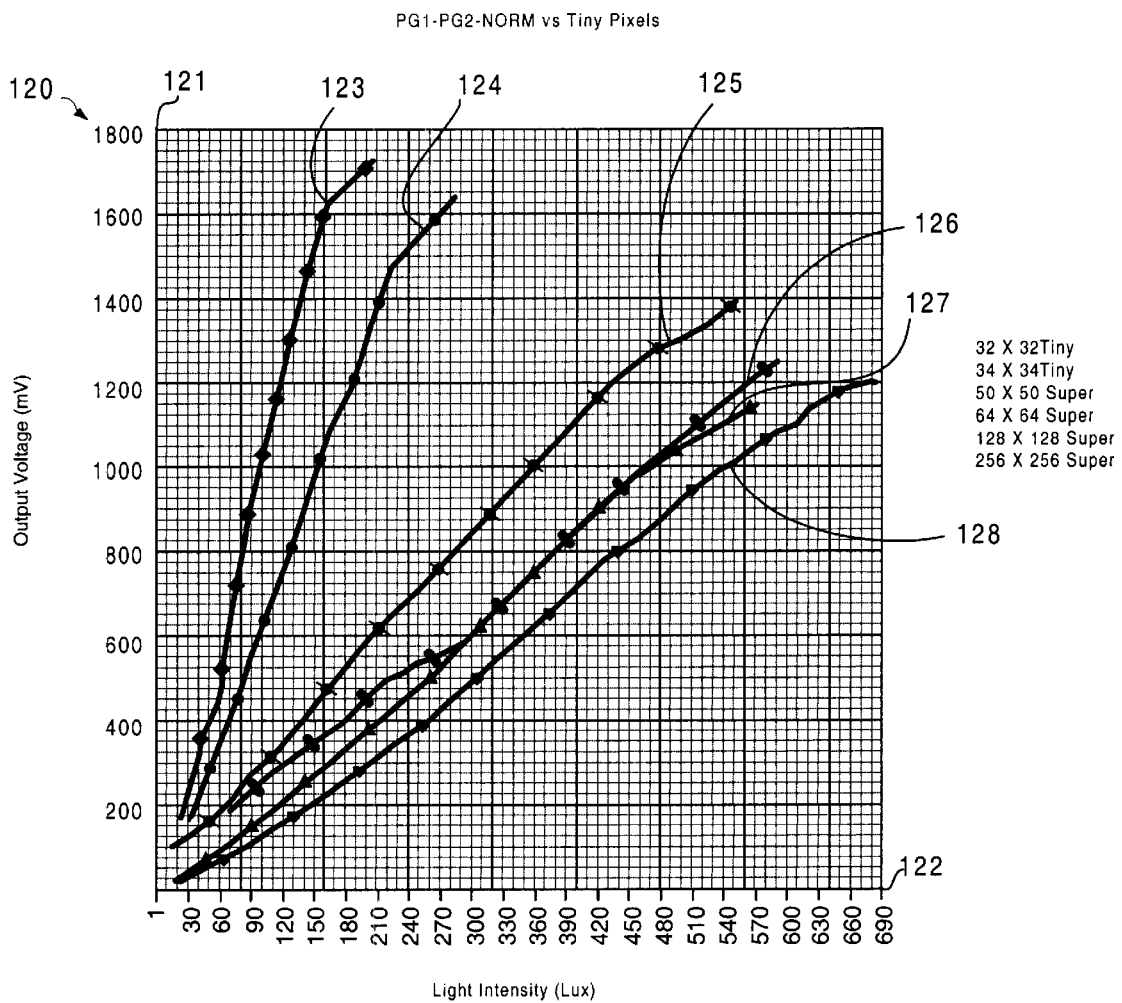
FIG. 5 illustrates the dynamic response of rexels of two different sizes without charge normalization.

Some test results of the dynamic response of larger rexels compared with smaller rexels are presented in FIG. 5. All of the rexels have the same sample area, which is equal to the total photo sensing area of the tiny pixels. They are fabricated in MOSIS 2 um Nwell technology.

FIG. 5 is obtained when PG1, PG2 and Norm are connected together, (there is no normalization) and the super pixel works the same as the tiny pixel. It shows the response comparison between the super pixels and the tiny ones. The testing conditions are integration time=20 $\mu$s: reset=2.51' to 51': $\Delta T=1 \mu s$. $\Delta T$ is the time between the measurement of the reset level at the FD gate and the level of the FD gate after the photogate charges are transferred onto it (the CDS time difference).

Generally, the bigger the rexels, the higher the output voltage under the same light intensity. But the testing results do not show any linear proportionality between the sensing area and the output voltage. A possible reason is due to charge leakage from the peripheral region of the potential well to the p-substrate.

It does not nullify the basic idea of the photo charge normalization approach because for the rexels the whole photo charge is never read out simultaneously. An important issue is the amount of photo charge under the sampling potential well and its subsequent output voltage.

Figure 6:
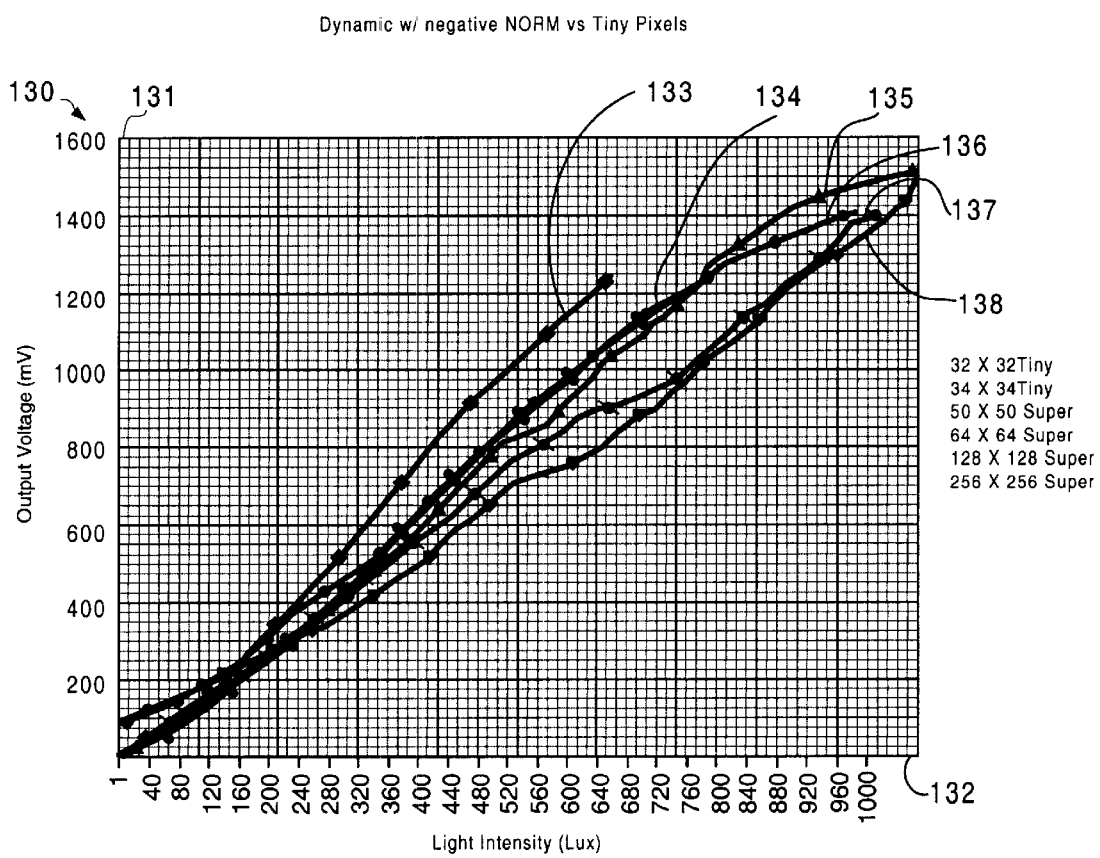
FIG. 6 illustrates the dynamic response of rexels of two different sizes with charge normalization.

FIG. 6 shows the dynamic response of super and tiny pixels when photo charge normalization is enabled. The output waveform is similar to the one in FIG. 3. The stimuli that drive the super pixels work in a dynamic way. There are two jumps in the output waveforn. The first one corresponds to the photo charge in the sampling potential well and the second one corresponds to the photo charge in the remaining big potential well. Here, only the first output voltage jump is measured and the second one is neglected. The test results show a good convergence of super pixels and tiny pixels.

Foveal Pixel Array Access Scheme

A new access scheme is adopted in this all CMOS foveal imager. Each ring will be read out row by row independent of the corresponding storage banks, so as to support correlated double sampling (CDS) circuitry. The final image data could be read out simultaneously from the different storage banks or in a serial mode through an analog mux. Dummy image data slots could be filled with embedded information or error detection/correction code. Currently these are ignored by the off-chip software.

Figure 7:
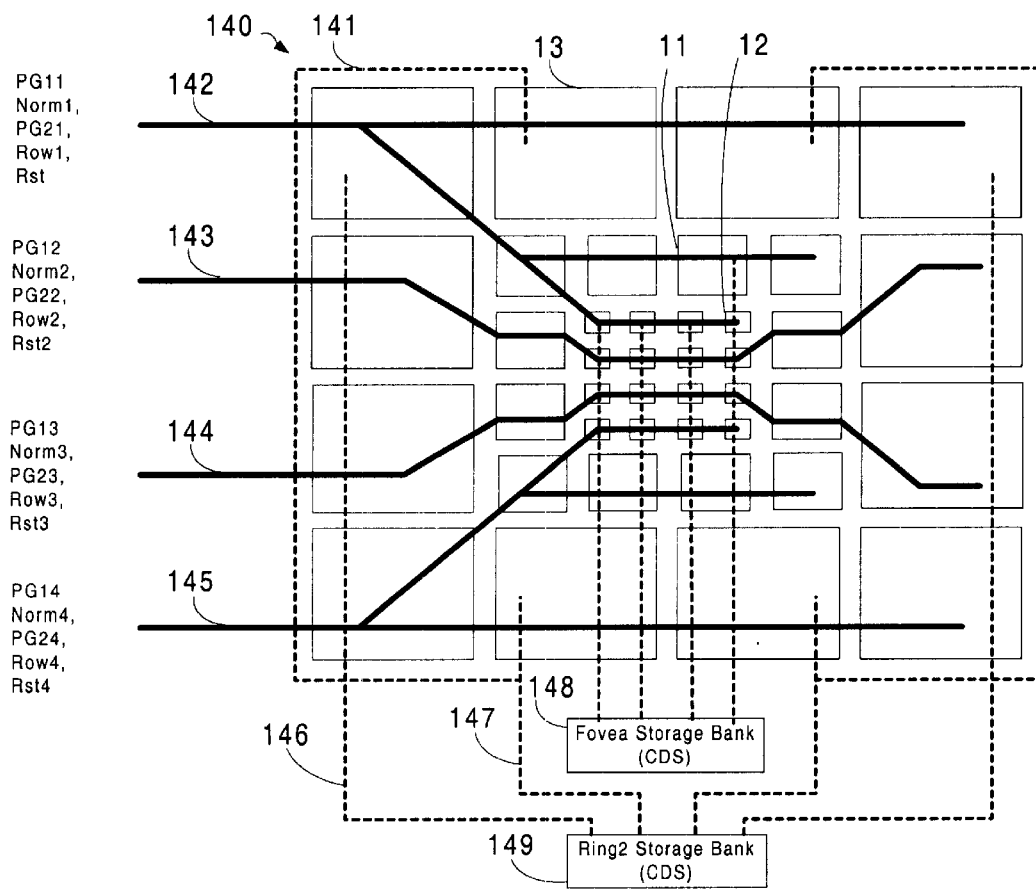
FIG. 7 illustrates the novel foveal sensing array access scheme of the present invention; and, FIGS. 8 and 9 are block diagrams of the whole integrated circuit chip of the present invention.

This kind of access scheme is shown in FIG. 7. Notice that the ring1 storage bank is not shown in the figure in order to avoid congestion.

A Prototype Foveal Image Sensor Chip

A proof-of-concept chip was realized with peripheral processing circuits including correlated double sampling, analog multiplexers and address decoders.

The sensing array of the chip has 40 pixels which includes one fovea region and two rings. The active pixels with photo charge normalization are used as the super pixels and the conventional active pixels without charge normalization are used as tiny ones in the fovea region. The pixel sizes are 32 um, 64 um. and 128 um. The corresponding pitches are 35 um. 70 um. and 140 um.

With the correlated double sampling, every storage bank has two analog outputs. Hence an external op-amp is needed to do the differencing operation. The chip fit into the MOSIS 2 um. (and 1.2 um) tiny chip frame.

Some special attention has been paid to place as much peripheral circuitry on the chip as possible, so that the kind of proof-of-concept chip would be easy to be generalized to a final usable chip and at the same time not lose the controlling flexibility as a testing chip.

A minor modification was made to connect together the controlling signals of the active pixels in the same row but in different rings (including the fovea region) to share one set of peripheral controlling circuits. Hence different rings will be accessed and read out simultaneously to their storage banks in parallel. Thus, the chip area is saved with flexible access.

While performing parallel read out, all the outputs are controlled by one common clock. Serial read-out can be accomplished by multiplexing several synchronous signals into one. If we only need the image data of one specific ring or the fovea region, then output of the analog mux should be left connected to the output of that specific storage bank. Each row has a separate controlling signal so that the integration time could be varied in a very large region. The entire chip was fit into the MOSIS 2 um (and 1.2 um) tiny chip frame.

Figure 8:
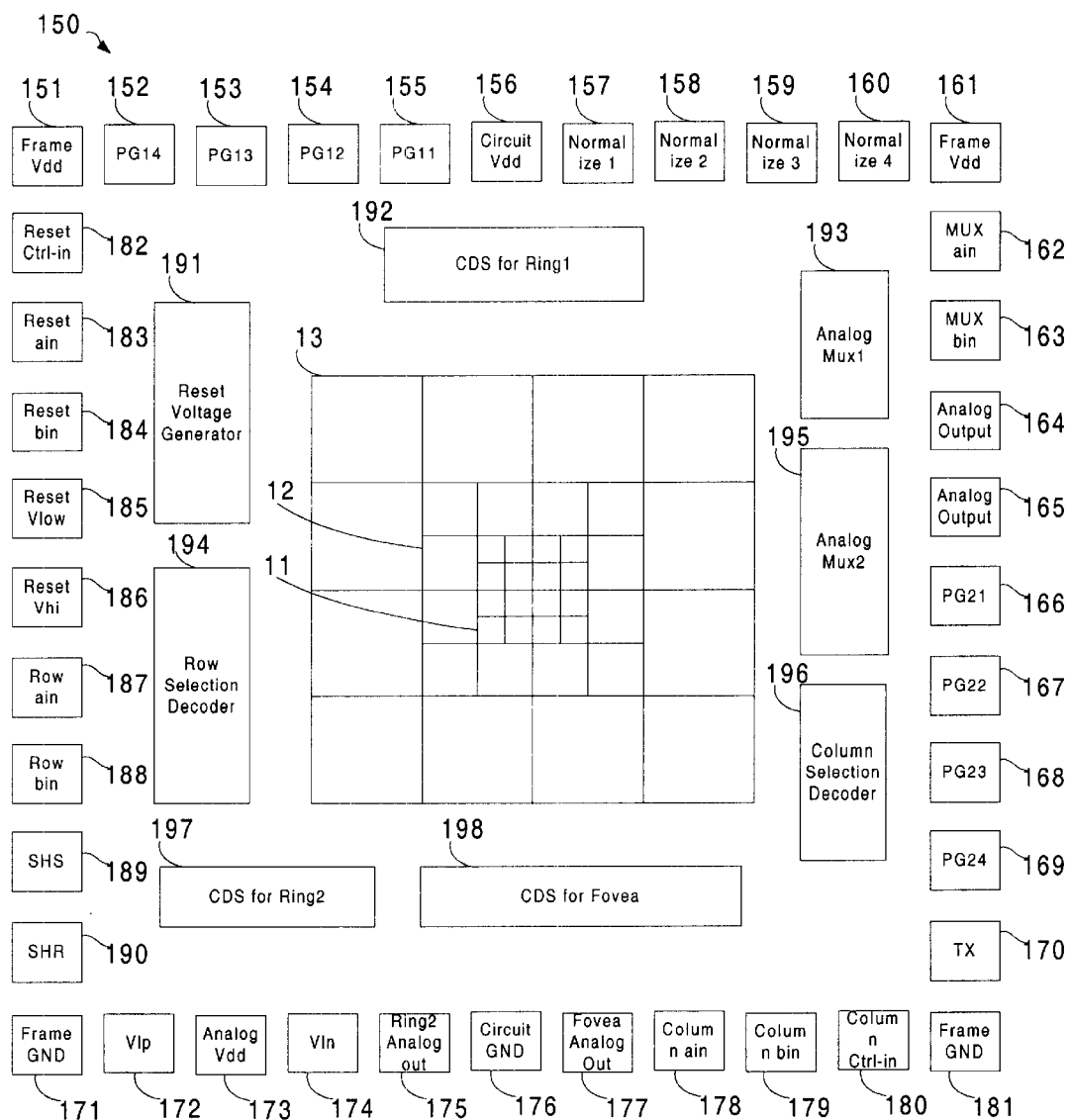
Figure 9:
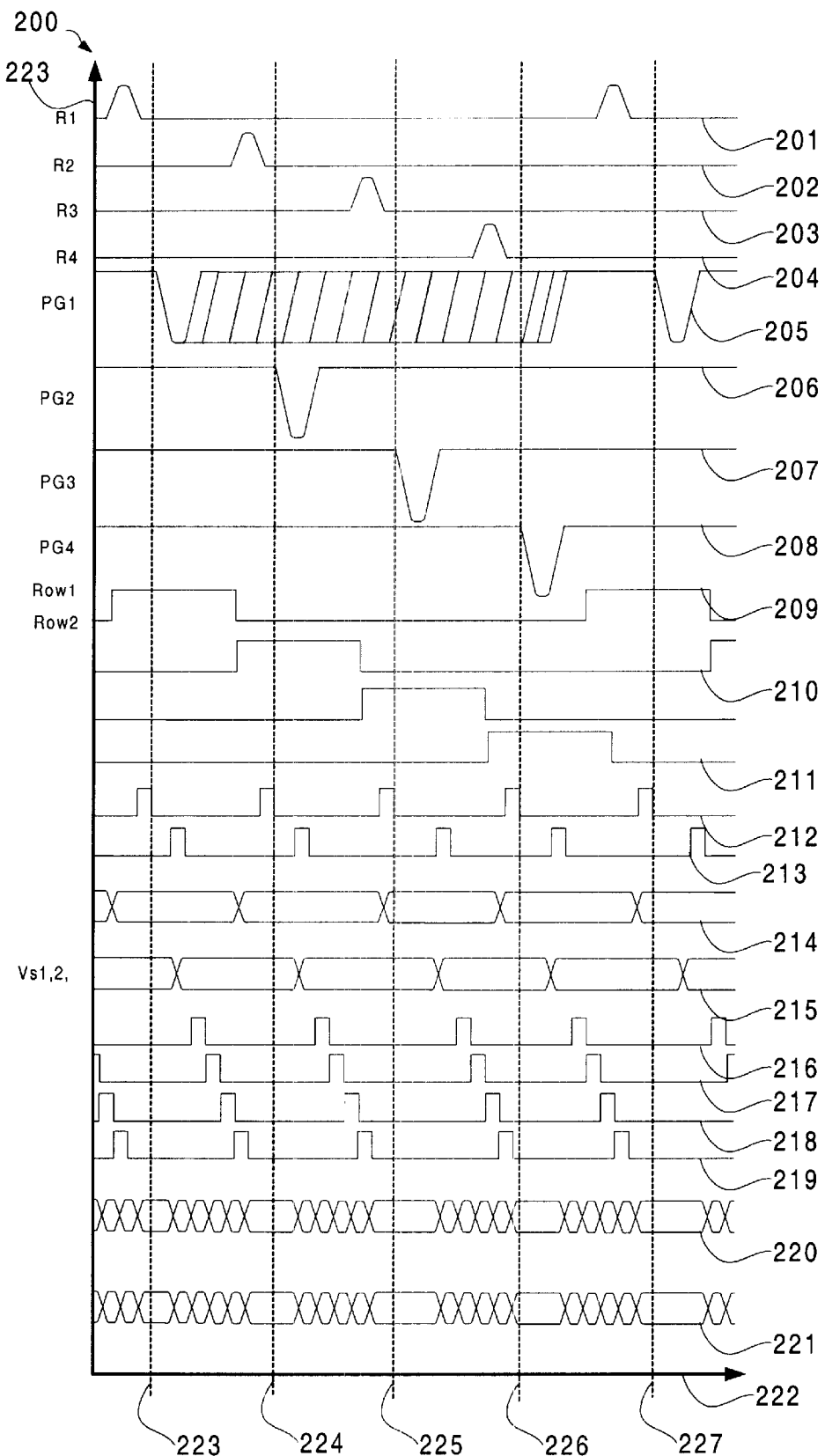

The block diagram of this chip is shown in FIG. 8 and the timing diagram for the entire chip is shown in FIG. 9. Also notice that in order to avoid congestion, some signals such as normalization are omitted deliberately and two groups of PG signals are combined to one group.

Thus, we have disclosed a foveal imager with a novel CMOS active pixel based design. We have also provided a description of the design, photo charge normalization and operation of the new circuit. An access scheme to the foveal sensing array was also presented. An r=2,d=1 foveal chip is described including block diagram and timing diagram. Results from the fabricated chips were also presented. It is clear that the objects of the invention are efficiently attained by the invention as described herein. It should be readily apparent to those having ordinary skill in the art that changes and modifications can be made to the present invention without departing from the spirit and scope of the invention as claimed.

What we claim is:

1. A foveal image sensor integrated circuit, comprising:
   a first plurality of CMOS active pixels of a first size arranged in a central fovea region on a substrate of said circuit;
   a second plurality of CMOS active pixels of a second size arranged in a first peripheral ring about said central fovea region; and,
   a normalization circuit operatively arranged to normalize a photocharge applied to each of said CMOS active pixels such that an output signal of each of said second size pixels is equal to an output signal of each of said first size pixels when said first and second size pixels are subjected to equal illumination.

2. The foveal image sensor integrated circuit recited in claim 1 where each of said second size pixels has a surface area which is larger than the surface area of each said first size pixels.

3. The foveal image sensor integrated circuit as recited in claim 2 where the surface area of each of said second size pixels is exponentially larger than the surface area of each of said first size pixels.

4. The foveal image sensor integrated circuit recited in claim 1 and further comprising a third plurality of CMOS active pixels of a third size arranged in a second peripheral ring about said first peripheral ring and said central fovea region wherein said normalization circuit is operatively arranged to normalize a photocharge applied to each of said different size pixels such that an output signal of each of said first, second and third size pixels is equal when each of said first, second and third size pixels are subjected to equal illumination.

5. The foveal image sensor integrated circuit recited in claim 4 where each of said third size pixels has a surface area which is larger than the surface area of each said second size pixels.

6. The foveal image sensor integrated circuit as recited in claim 5 where the surface area of each of said third size pixels is exponentially larger than the surface area of each of said second size pixels.

* * * * *

UNITED STATES PATENT AND TRADEMARK OFFICE
CERTIFICATE OF CORRECTION

PATENT NO.    : 6,455,831 B1
DATED         : September 24, 2002
INVENTOR(S)   : Cesar Bandera et al.

It is certified that error appears in the above-identified patent and that said Letters Patent is hereby corrected as shown below:

Column 1,
Lines 6-10, reads "The U.S. Government has a paid-up license in this invention and the right in limited circumstances to require the patent owner to license others on reasonable terms as provided for by the terms of Contract No. NAS1-20841 awarded by N.A.S.A." should read -- This invention was made with Government support under Contract NAS1-20641 awarded by NASA. The government has certain rights to this invention. --.

Signed and Sealed this

Fifteenth Day of November, 2005

JON W. DUDAS
*Director of the United States Patent and Trademark Office*